(12) United States Patent
Yeh et al.

(10) Patent No.: US 8,164,000 B2
(45) Date of Patent: Apr. 24, 2012

(54) FLEXIBLE PRINTED CIRCUIT BOARDS INCLUDING CARBON NANOTUBE BUNDLES

(75) Inventors: Tso-Hung Yeh, Taoyuan (TW); Hung-Yi Chang, Taoyuan (TW); Shing-Tza Liou, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 989 days.

(21) Appl. No.: 12/135,849

(22) Filed: Jun. 9, 2008

(65) Prior Publication Data
US 2009/0032290 A1    Feb. 5, 2009

(30) Foreign Application Priority Data
Aug. 3, 2007   (CN) .......................... 2007 1 0075616

(51) Int. Cl.
*H05K 1/00* (2006.01)
(52) U.S. Cl. .................... 174/254; 174/255; 174/252
(58) Field of Classification Search .................. None
See application file for complete search history.

(56) References Cited

U.S. PATENT DOCUMENTS

| | | | | |
|---|---|---|---|---|
| 7,943,855 B2* | 5/2011 | Cheng et al. | ................... | 174/252 |
| 2004/0211589 A1* | 10/2004 | Chou et al. | ................... | 174/253 |
| 2006/0234056 A1* | 10/2006 | Huang et al. | ................... | 428/408 |
| 2007/0138010 A1* | 6/2007 | Ajayan | ................... | 204/400 |
| 2007/0244245 A1* | 10/2007 | Liu et al. | ................... | 524/496 |

FOREIGN PATENT DOCUMENTS

WO     2006048843 A2    5/2006

* cited by examiner

*Primary Examiner* — Ishwarbhai Patel
(74) *Attorney, Agent, or Firm* — Altis Law Group, Inc.

(57) ABSTRACT

A flexible printed circuit board base film for flexible printed circuit boards includes a sheet of flexible polymer matrix and a number of carbon nanotube bundles embedded in the polymer matrix. Each of the nanotubes bundles are spaced apart from each other. The flexible polymer matrix includes a first surface and a second surface. Due to the high thermal conductivity of carbon nanotubes, heat can be efficiently conducted from the first surface to the second surface of the flexible printed circuit board base film. The present invention also provides a flexible laminate made from the flexible printed circuit board base film and a flexible printed circuit boards made from the flexible laminate.

19 Claims, 18 Drawing Sheets

FLEXIBLE PRINTED CIRCUIT BOARDS INCLUDING CARBON NANOTUBE BUNDLES

BACKGROUND

1. Technical Field

The present invention relates to flexible printed circuit boards (FPCBs) and, more specifically, relates to flexible printed circuit board base films, flexible laminates made from the flexible printed circuit board base films, and FPCBs made from the flexible laminates.

2. Discussion of Related Art

Flexible printed circuit boards (FPCBs) are widely used in various electronic devices such as mobile phones, printing heads, and hard disk drives for providing electrical transmission to moving parts, due to its excellent flexibility. With the development of electronic technology, FPCBs are required to have high circuit density and multilayer FPCBs are used to replace single sided or doubled sided FPCBs.

A thermal dissipating ability of an FPCB is not a concern when the FPCB is single sided or double sided, but the thermal dissipating ability becomes a big issue in multilayer FPCBs, especially for high density multilayer FPCBs. Generally, FPCBs are made from flexible copper clad laminates, which include a flexible printed circuit board base film and a copper layer formed on the flexible printed circuit board base film. A typical flexible printed circuit board base film is polyimide film. Polyimide has excellent flexibility. However, polyimide has poor coefficient of heat conductivity.

Therefore, there is a desire to provide a flexible printed circuit board base film having improved thermal dissipating ability.

SUMMARY

In one embodiment, a flexible printed circuit board base film includes a flexible polymer matrix and a carbon nanotube array embedded therein. The flexible polymer matrix includes a first surface and a second surface.

This and other features and advantages of the present invention as well as the preferred embodiments thereof and a flexible printed circuit board base film, a flexible laminate, and a flexible printed circuit board in accordance with the invention will become apparent from the following detailed description and the descriptions of the drawings.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention.

DETAILED DESCRIPTION OF THE EXEMPLARY EMBODIMENTS

Figure 1:
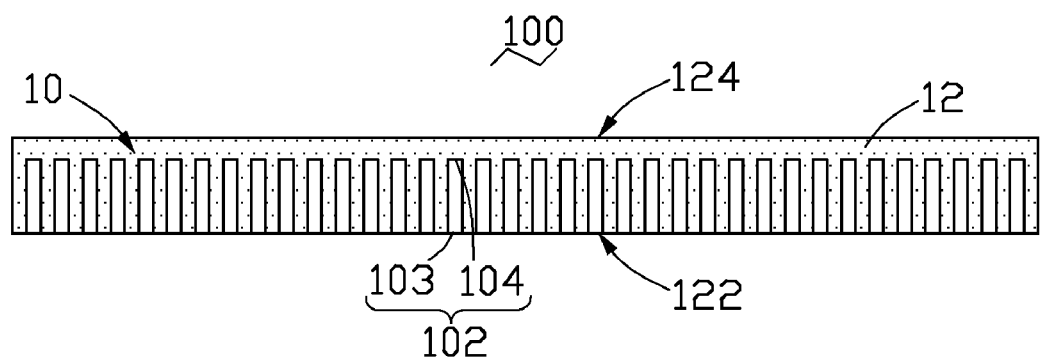
FIG. 1 is a cross sectional schematic view showing a flexible printed circuit board base film in accordance with a first embodiment.

FIG. 1 illustrates a flexible printed circuit board base film 100 in accordance with a first embodiment, which includes a carbon nanotube (CNT) array 10 and a flexible polymer matrix 12. The CNT array 10 includes a number of spaced and substantially parallel CNT bundles 102. Each CNT bundle 102 includes a first end 103 and a second end 104. The polymer matrix 12 is a flat sheet including a first surface 122 and a second surface 124 opposite to the first surface 122.

Figure 2:
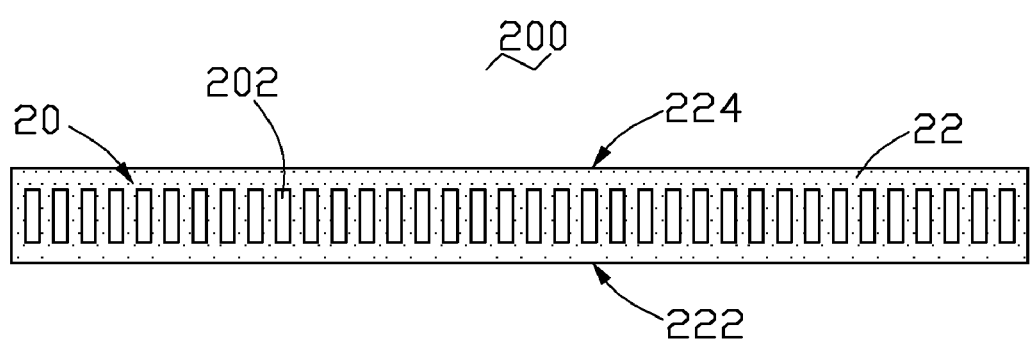
FIG. 2 is a cross sectional schematic view showing a flexible printed circuit board base film in accordance with a second embodiment.

The CNT bundles 102 are embedded in the polymer matrix 12. In the first embodiment, each of the CNT bundles 102 extends vertically from the first surface 122 toward the second surface 124. A length of each of the CNT bundles 102 is less than a thickness of the polymer matrix 12. The first end 103 of each of the CNT bundles 102 is coplanar with the first surface 122. In other words, the first end 103 of each of the CNT bundles 102 is exposed outwardly from the first surface 122. However, it is to be understood that the first end 103 of each of the CNT bundles 102 can be buried under the first surface 122. For example, referring to FIG. 2, in a flexible printed circuit board base film 200 in accordance with a second embodiment, both ends of each CNT in the CNT array 20 are buried in the polymer matrix.

Figure 3:
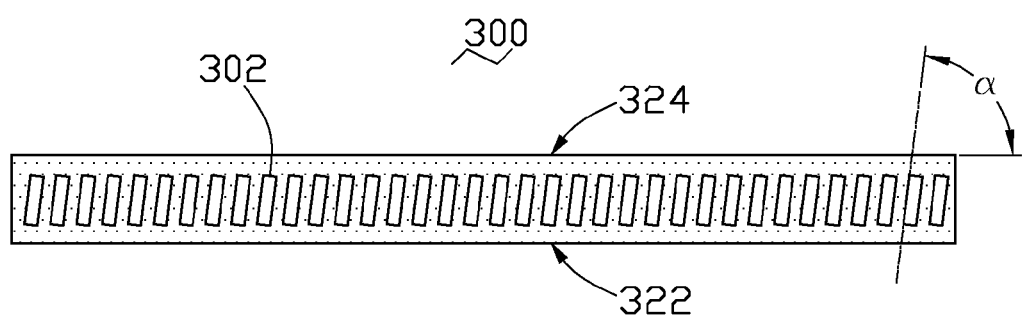
FIG. 3 is a cross sectional schematic view showing a flexible printed circuit board base film in accordance with a third embodiment.

Referring to FIG. 3, a flexible printed circuit board base film 300 in accordance with a third embodiment is similar to that of the first embodiment except that the extending direction of the CNT bundles 302. Each of the CNT bundles 302 extends from the first surface 322 to the second surface 324 at an angle α in a range from about 60° to about 90°. Preferably, the angle α is in a range from about 75° to about 90°.

Figure 4:
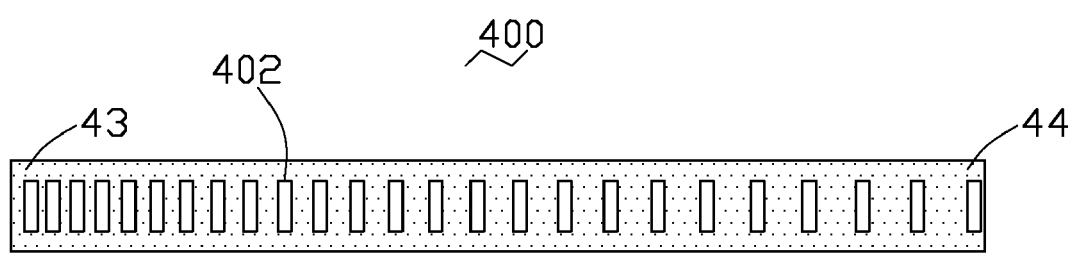
FIG. 4 is a cross sectional schematic view showing a flexible printed circuit board base film in accordance with a fourth embodiment.

Referring to FIG. 4, a flexible printed circuit board base film 400 in accordance with a fourth embodiment is similar to that of the first embodiment except for the manner of distribution of the CNT bundles 402. A polymer matrix 42 includes a first end 43 and a second end 44. A distribution density of the CNT bundles 402 gradually decreases from the first end 43 to the second end 44, in other words, distance between two adjacent CNT bundles gradually increases from the first end 43 to the second end 44.

The CNT bundles 102, 202, 302, 402 can be single-wall carbon nanotubes (SWCNT bundles) or multi-wall carbon nanotubes (MWCNT bundles). A length of the CNT bundles can be in the range from about 1 micrometer to about 30 micrometers. A volume content of the CNT bundles in the flexible printed circuit board base film 100, 200, 300, 400 can be in a range from 1% to 50%. As such, the flexible printed circuit board base film 100, 200, 300, 400 have both good flexibility and good heat dissipation efficiency. The polymer matrix can be selected from the group consisting of polyimide, polyethylene terephthalate, polytetrafluoroethylene, polyamide, poly(methyl methacrylate), polycarbonate and polyamide polyethylene-terephthalate copolymer.

In the flexible printed circuit board base films 100, 200, 300, 400, the CNT bundles are buried under at least one surface of the polymer matrix; therefore, the CNT bundles in the flexible printed circuit board base film can be electrically isolated from a conductive layer disposed on the surface. Due to the high thermal conductivity of carbon nanotubes, heat can be efficiently conducted from the first surface to the second surface. Furthermore, because the CNT bundles are spaced from and parallel to each other, the flexible printed circuit board base films 100, 200, 300,400 can retain a high flexibility.

Figure 5:
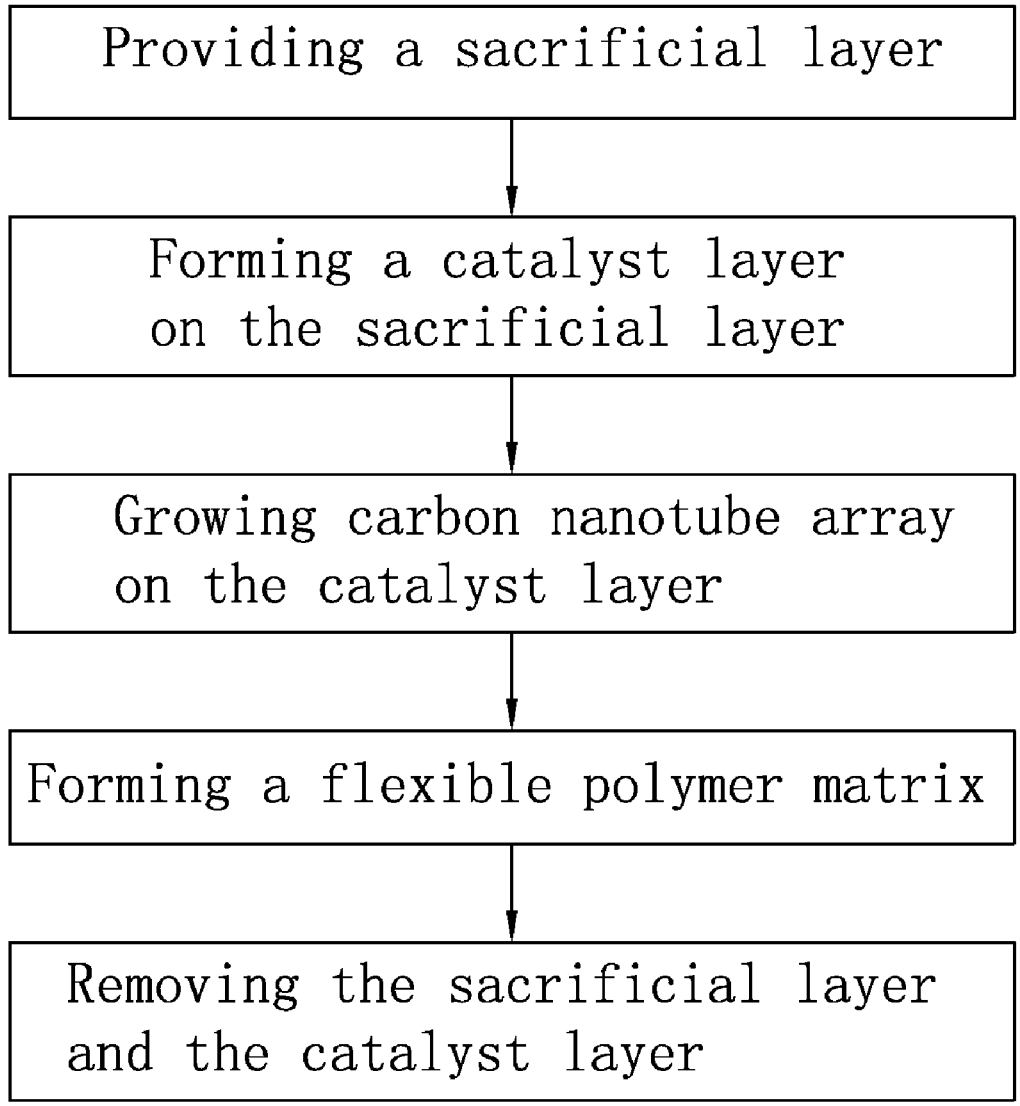
FIG. 5 is a flow chart of a method of manufacturing the flexible printed circuit board base film of FIG. 1.

FIG. 5 illustrates a flow chart of a method of manufacturing the flexible printed circuit board base film 100. The method will be described in accompaniment with FIGS. 6 to 11 in detail.

Figure 6:
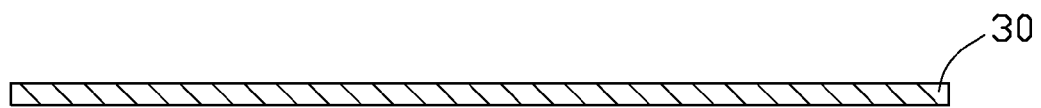
FIGS. 6-12 are schematic views showing successive steps of the method in FIG. 5.

In step 1, referring to FIG. 6, a sacrificial layer 30 is provided. The sacrificial layer 30 can be made of a metal such as copper, aluminum, and nickel. A thickness of the sacrificial layer 30 can be in a range from about 2 micrometers to about 200 micrometers.

Figure 7:
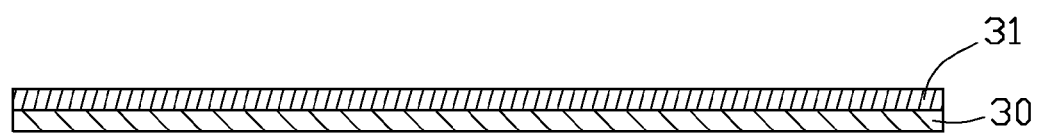
Figure 8:
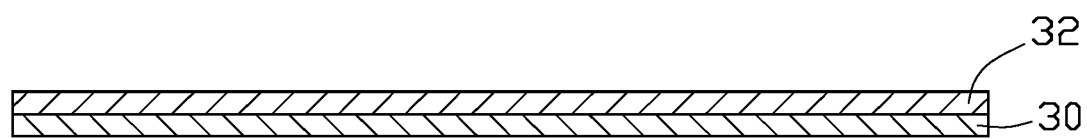
Figure 9:
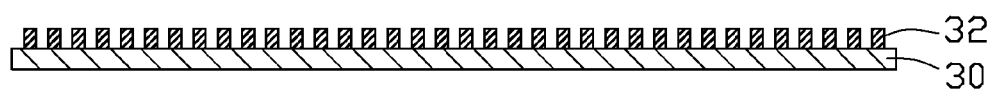

In step 2, referring to FIGS. 7 to 9, a catalyst layer 32 is formed on the sacrificial layer 30. Firstly, referring to FIG. 7, a catalyst precursor film 31 comprised of iron, cobalt, nickel and alloy thereof is deposited on a surface of the sacrificial layer 30. The catalyst precursor film 31 can be deposited by using electro-deposition, evaporation, sputtering, or vapor deposition. Secondly, referring to FIG. 8, the catalyst precursor film 31 is oxidized to form a catalyst film 32 on a surface of the sacrificial layer 30. Specifically, the sacrificial layer 30 and the catalyst precursor film 31 can be sintered in a furnace for oxidizing the catalyst precursor film 31. Thirdly, referring to FIG. 9, the catalyst layer 32 is patterned using a lithography method. The catalyst layer 32 includes a number of catalyst particles distributed therein.

Figure 10:
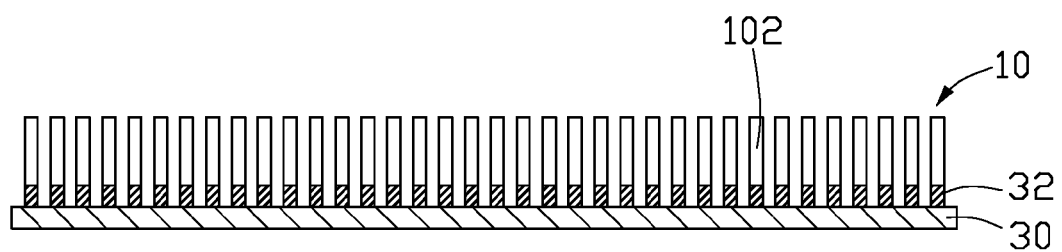

In step 3, referring to FIG. 10, the CNT array 10 is formed on the catalyst layer 32. The sacrificial layer 30 with the catalyst layer 32 formed thereon is placed on a carrier boat disposed in a reaction furnace, for example, a quartz tube, an inner temperature of the reaction furnace is elevated to about 700° C. to 1000° C. and then a carbon source gas such as acetylene and ethylene is introduced into the reaction furnace. CNT bundles 102 grow from the catalyst layer 32. A height of the CNT bundles 102 can be set by controlling time of reacting, generally, a height of the CNT bundles 102 is controlled to be in a range from 1 micrometer to 30 micrometers, and a direction of the CNT bundles 102 can be controlled with an electric field. The detail of the method of growing CNT bundles 102 is well known and can be learned by referencing Science, 1999, 283, p 512-414, J. Am. Chem. Soc, 2001, 123, p 11502-11503, and U.S. Pat. No. 6,350,488. Because the catalyst layer 32 is patterned, the obtained CNT bundles 102 are separated from each other.

Figure 11:
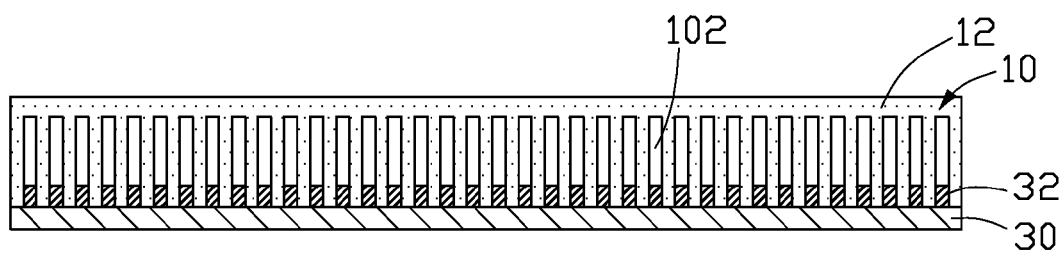

In step 4, referring to FIG. 11, the flexible polymer matrix 12 is formed. Firstly, a flexible polymer precursor or a solution of the flexible polymer precursor is applied on the CNT array 10 using dip-coating or brush coating. The CNT array 10 is embedded in the flexible polymer precursor. Preferably, ultrasonic oscillation is performed so that the flexible polymer precursor can fully fill the gaps in the CNT array. The polymer precursor can be selected form a group consisting of polyimide oligomer, polyethylene terephthalate oligomer, polytetrafluoroethylene oligomer, polyamide oligomer, poly (methyl methacrylate) oligomer, polycarbonate and polyamide polyethylene-terephthalate co-oligomer. The flexible polymer precursor is then cured by heating. Crosslink reaction will occur in the flexible polymer precursor thereby forming the flexible polymer matrix 12.

Figure 12:
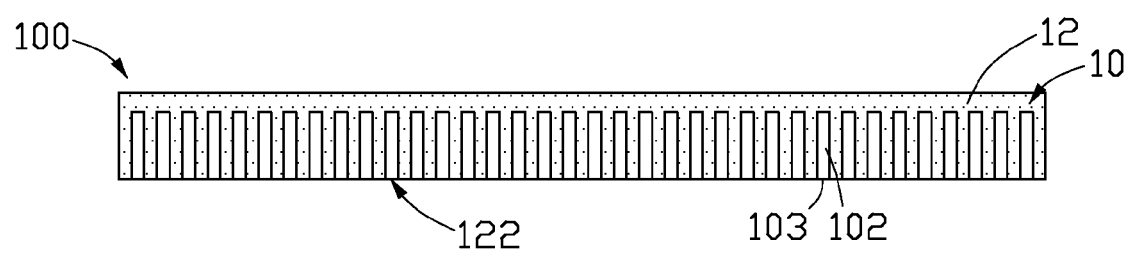

In step 5, referring to FIG. 12, the sacrificial layer 30 and the catalyst layer 32 are removed thereby the flexible printed circuit board base film 100 is obtained. The sacrificial layer 30 and the catalyst layer 32 can be removed using an etching method. For example, when the sacrificial layer 30 is made of copper and the catalyst layer 32 is made of ferric oxide, a ferric chloride solution can be used to etch the sacrificial layer 30 and the catalyst layer 32. In the method described above, if step 5 is performed prior to step 4, two ends of the CNT bundles 102 will be buried under the polymer matrix, that is, a flexible printed circuit board base film 200 is obtained.

Figure 13:
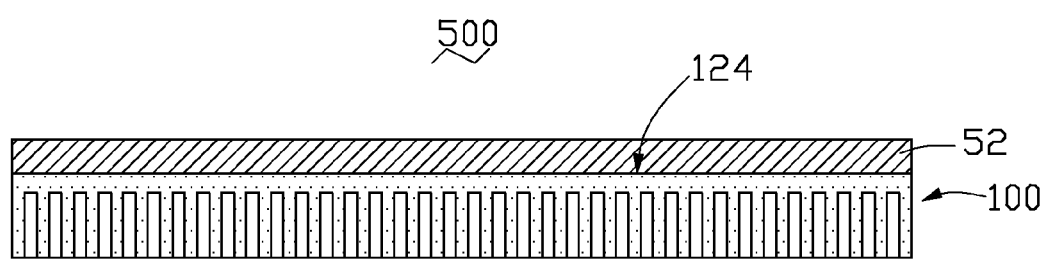
FIG. 13 is a cross sectional schematic view showing a flexible laminate made from the flexible printed circuit board base film of FIG. 1.

FIG. 13 illustrates a flexible laminate 500 made from the flexible printed circuit board base film 100. The flexible laminate 500 includes the flexible printed circuit board base film 100 and a conductive layer 52 formed on the second surface 124 of the polymer matrix 12. The conductive layer 52 is made of a metal of high conductivity such as copper, silver and aluminum. The conductive layer 52 can be electrodeposited or directly laminated on the second surface of the polymer matrix 12. A thickness of the conductive layer 52 is in a range from about 1 micrometer to about 50 micrometers. In order to improve adhesion between the polymer matrix 12 and the conductive layer 52, an intermediate layer such as nickel can be preformed on the second surface 124 during electrodeposition of the conductive layer 52.

Figure 14:
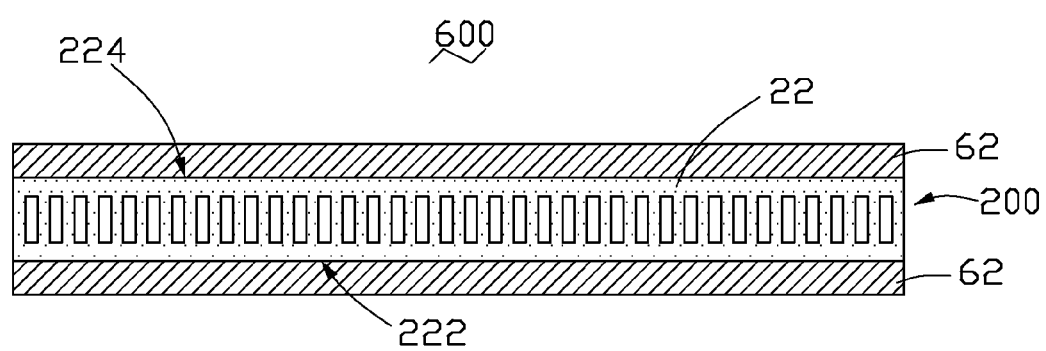
FIG. 14 is a cross sectional schematic view showing a flexible laminate made from the flexible printed circuit board base film of FIG. 2.

FIG. 14 illustrates a flexible laminate 600 made form the flexible printed circuit board base film 200. The flexible laminate 600 includes the flexible printed circuit board base film 200 and two opposite conductive layers 62 formed on the first surface 222 and the second surface 224 respectively. The conductive layers 62 are made of a metal of high conductivity such as copper, silver and aluminum. The conductive layers 62 can be electrodeposited or directly laminated on the polymer matrix 22. A thickness of each of the conductive layers 62 is in a range from about 1 micrometer to about 50 micrometers.

Figure 15:
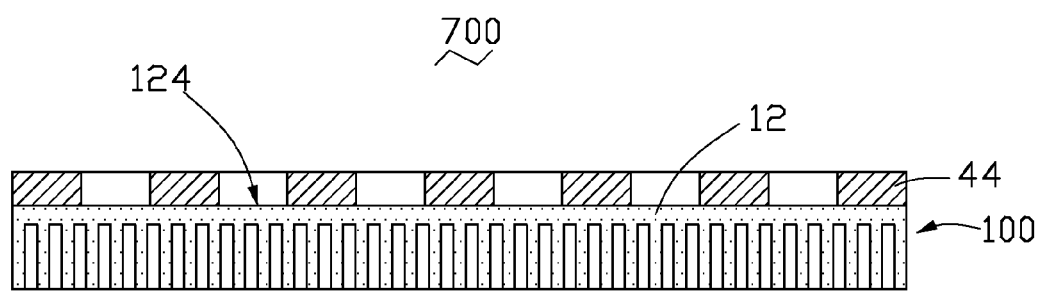
FIG. 15 is a cross sectional schematic view showing a flexible printed circuit board made from the flexible laminate of FIG. 13.

FIG. 15 illustrates a FPCB 700 made from the flexible laminate 500. The conductive layer 52 of the flexible laminate 500 is made into a number of conductive traces 44. Any technology for making conductive pattern well known in printed circuit board manufacturing can be used to manufacture the conductive traces 44. For example, in an etching method, patterned photoresist can be applied on the conductive layer 42, and the photoresist partially exposed then developed. After the developing step, the conductive layer 42 is etched with an etchant and the remaining photoresist is employed as a protective layer of the conductive layer 42. The remaining photoresist will be removed after the etching step and the FPCB 700 is thereby obtained. The conductive traces 44 are formed on the second surface 124 of the flexible polymer matrix 12. The FPCB 700 is a single-sided FPCB. It is understood that a double sided FPCB can be made from the flexible printed circuit board base film 200 using a similar method.

Figure 16:
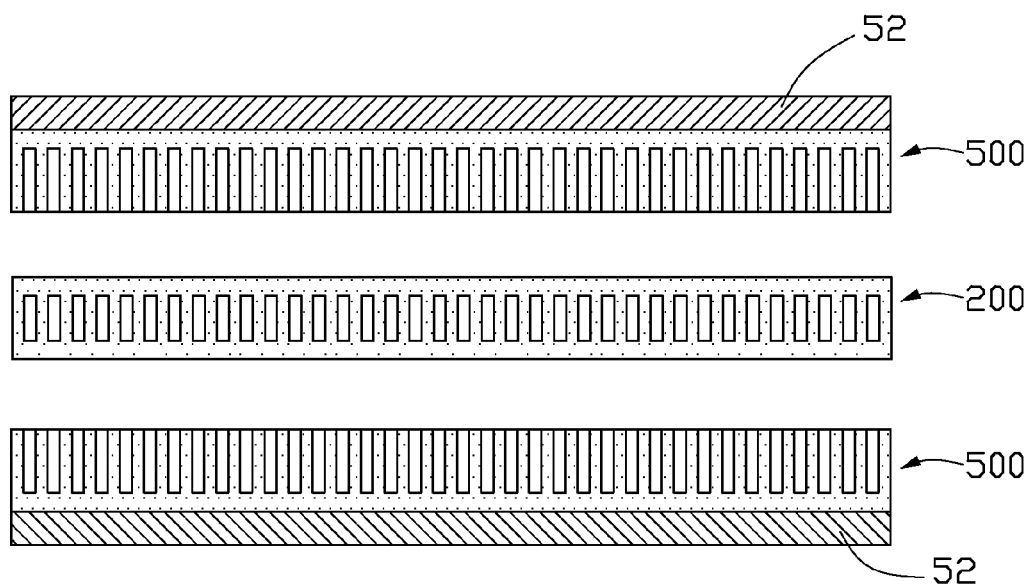
FIGS. 16-18 are schematic views showing a multilayer flexible printed circuit board made from the flexible laminate of FIG. 13.
Figure 17:
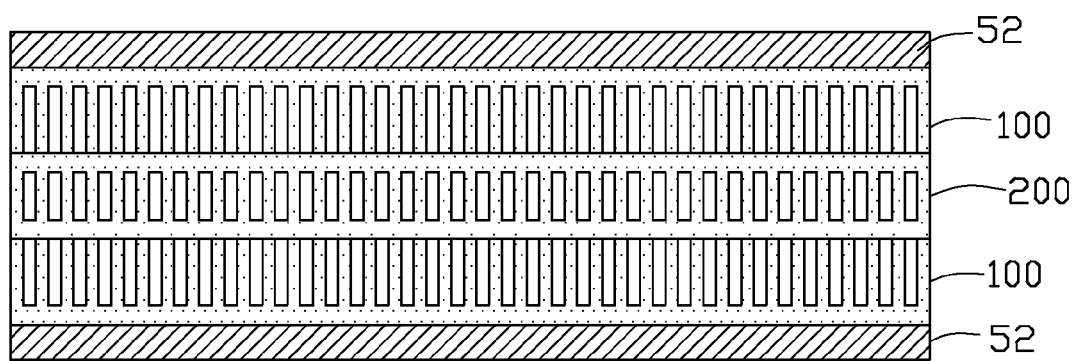
Figure 18:
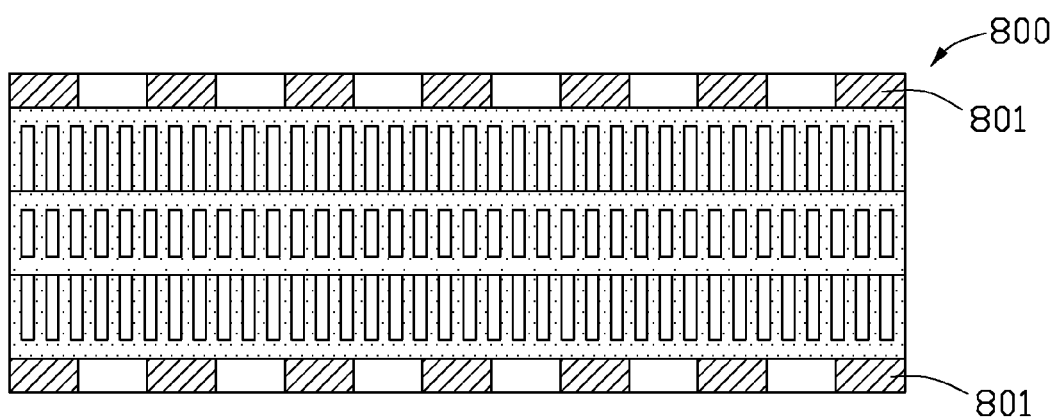

Furthermore, the flexible laminate 500 can also be used to manufacture multilayer FPCBs. Firstly, referring to FIG. 16, two flexible laminates 500 and a flexible printed circuit board base film 200 are provided. Secondly, referring to FIG. 17, the two flexible laminates 500 and the flexible printed circuit board base film 200 are laminated. Thirdly, referring to FIG. 18, the conductive layers 52 in the two flexible laminate 500 are made into conductive traces 801. It is understood that if additional flexible laminates 500 are laminated on the FPCB 800, a multilayer FPCB can be obtained.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A flexible printed circuit board, comprising:
a flexible printed circuit board base film comprising:
a sheet of flexible polymer matrix comprising a first surface and an opposite second surface, and
a carbon nanotube array comprising a plurality of carbon nanotube bundles embedded in the sheet of flexible polymer matrix, wherein a distribution density of the carbon nanotubes bundles gradually decreases in a given direction perpendicular to a thickness direction of the sheet of the flexible polymer matrix, and electrically conductive traces formed on the flexible printed circuit board base film.

2. The flexible printed circuit board as claimed in claim 1, wherein each of the carbon nanotubes bundles extends in a direction from the first surface to the second surface at an angle in a range from 60° to 90° with the first surface.

3. The flexible printed circuit board as claimed in claim 1, wherein the electrically conductive traces formed on the second surface of the flexible polymer matrix, and each of the carbon nanotube bundles comprises a first end and an opposite second end, the first end of each of the carbon nanotube bundles is in the flexible polymer matrix and is adjacent to the first surface, the second end of each of the carbon nanotube bundles is embedded in the flexible polymer matrix and spaced a distance from the second surface of the flexible polymer matrix.

4. The flexible printed circuit board as claimed in claim 1, wherein the carbon nanotube bundles are substantially parallel with each other.

5. The flexible printed circuit board as claimed in claim 1, wherein each of the carbon nanotube bundles comprises a first end and an opposite second end, the first end of each of the carbon nanotube bundles is exposed at the first surface.

6. The flexible printed circuit board as claimed in claim 5, wherein the second end of each of the carbon nanotube bundles is in the flexible polymer matrix and is spaced a distance from the second surface of the flexible polymer matrix.

7. The flexible printed circuit board as claimed in claim 1, wherein a percentage by volume of the carbon nanotubes bundles is in a range from 1% to 50%.

8. A flexible primed circuit board, comprising:
a flexible printed circuit board base film comprising:
a sheet of flexible polymer matrix comprising a first surface and an opposite second surface, and
a carbon nanotube array comprising a plurality of carbon nanotube bundles embedded in the sheet of flexible polymer matrix, a distribution density of the carbon nanotubes bundles gradually decreasing in a given direction perpendicular to a thickness direction of the sheet of the flexible polymer matrix, and electrically conductive traces formed on the second surface of the flexible printed circuit board base film.

9. The flexible printed circuit board as claimed in claim 8, wherein the carbon nanotube bundles are substantially parallel with each other.

10. The flexible printed circuit board as claimed in claim 8, wherein each of the carbon nanotubes bundles extends in a direction from the first surface to the second surface at an angle in a range from 60° to 90° with the first surface.

11. The flexible printed circuit board as claimed in claim 8, wherein each of the carbon nanotube bundles comprises a first end and an opposite second end, the first end of each of the carbon nanotube bundles is in the polymer matrix and spaced a distance from the first surface, the second end of each of the carbon nanotube bundles is in the flexible polymer matrix and spaced a distance from the second surface.

12. The flexible printed circuit board as claimed in claim 8, wherein each of the carbon nanotube bundles comprises a first end and an opposite second end, the first end of each of the carbon nanotube bundles is exposed at the first surface, the second end of each of the carbon nanotube bundles is in the flexible polymer matrix and is spaced a distance from the second surface of the flexible polymer matrix.

13. The flexible printed circuit board as claimed in claim 8, wherein a percentage by volume of the carbon nanotubes bundles is in a range from 1% to 50%.

14. A flexible primed circuit board, comprising:
a flexible printed circuit board base film comprising:
a sheet of flexible polymer matrix comprising a first surface and an opposite second surface, and
a carbon nanotube array comprising a plurality of carbon nanotube bundles embedded in the sheet of flexible polymer matrix, a distance between each two adjacent carbon nanotube bundles in the flexible polymer matrix decreasing in a given direction perpendicular to a thickness direction of the sheet of the flexible polymer matrix, and
electrically conductive traces formed on the second surface of the flexible printed circuit board base film.

15. The flexible printed circuit board as claimed in claim 14, wherein the carbon nanotube bundles are substantially parallel with each other.

16. The flexible printed circuit board as claimed in claim 14, wherein each of the carbon nanotubes bundles extends in a direction from the first surface to the second surface at an angle in a range from 60° to 90° with the first surface.

17. The flexible printed circuit board as claimed in claim 14, wherein each of the carbon nanotube bundles comprises a first end and an opposite second end, the first end of each of the carbon nanotube bundles is in the polymer matrix and spaced a distance from the first surface, the second end of each of the carbon nanotube bundles is in the flexible polymer matrix and spaced a distance from the second surface.

18. The flexible printed circuit board as claimed in claim 14, wherein each of the carbon nanotube bundles comprises a first end and an opposite second end, the first end of each of the carbon nanotube bundles is exposed at the first surface, the second end of each of the carbon nanotube bundles is in the flexible polymer matrix and is spaced a distance from the second surface of the flexible polymer matrix.

19. The flexible printed circuit board as claimed in claim 14, wherein a percentage by volume of the carbon nanotubes bundles is in a range from 1% to 50%.

* * * * *